US009224791B2

(12) United States Patent
Kim

(10) Patent No.: US 9,224,791 B2
(45) Date of Patent: Dec. 29, 2015

(54) ORGANIC LIGHT-EMITTING DISPLAY APPARATUS AND METHOD OF MANUFACTURING THE SAME

(71) Applicant: Samsung Display Co., Ltd., Yongin (KR)

(72) Inventor: Do-Hoon Kim, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 31 days.

(21) Appl. No.: 14/185,414

(22) Filed: Feb. 20, 2014

(65) Prior Publication Data

US 2015/0102292 A1 Apr. 16, 2015

(30) Foreign Application Priority Data

Oct. 14, 2013 (KR) .......................... 10-2013-0122211

(51) Int. Cl.
| | |
|---|---|
| *H01L 51/52* | (2006.01) |
| *H01L 51/10* | (2006.01) |
| *H01L 27/32* | (2006.01) |
| *H01L 51/00* | (2006.01) |

(52) U.S. Cl.
CPC ........ *H01L 27/3246* (2013.01); *H01L 27/3258* (2013.01); *H01L 27/3272* (2013.01); *H01L 51/0023* (2013.01); *H01L 51/5246* (2013.01)

(58) Field of Classification Search
CPC ................................. H01L 51/52; H01L 51/10
USPC ........................................ 257/40, 59, E51.022
See application file for complete search history.

(56) References Cited

U.S. PATENT DOCUMENTS

| | | | |
|---|---|---|---|
| 2010/0171107 A1* | 7/2010 | Jung et al. ........................ | 257/40 |
| 2012/0097928 A1 | 4/2012 | Kim et al. | |
| 2013/0001533 A1 | 1/2013 | Kim et al. | |
| 2013/0148062 A1 | 6/2013 | Liang et al. | |
| 2014/0085551 A1* | 3/2014 | Koo et al. ........................ | 349/12 |

FOREIGN PATENT DOCUMENTS

| | | |
|---|---|---|
| KR | 10-2010-0125502 | 12/2010 |
| KR | 10-2012-0061106 | 6/2012 |
| KR | 10-2013-0007006 | 1/2013 |
| KR | 10-2013-0071823 | 7/2013 |

* cited by examiner

*Primary Examiner* — Marc Armand
(74) *Attorney, Agent, or Firm* — H.C. Park & Associates, PLC

(57) ABSTRACT

An exemplary embodiment of the present invention discloses an organic light-emitting display apparatus including: a display substrate including pixel areas and a non-pixel area; a sealing substrate disposed facing the display substrate; a spacer disposed in the non-pixel area of the display substrate, between the display substrate and the sealing substrate, and configured to maintain an interval between the display substrate and the sealing substrate; and a metal layer disposed under the spacer.

20 Claims, 12 Drawing Sheets

ORGANIC LIGHT-EMITTING DISPLAY APPARATUS AND METHOD OF MANUFACTURING THE SAME

CROSS REFERENCE TO RELATED APPLICATION

This application claims priority from and the benefit of Korean Patent Application No. 10-2013-0122211, filed on Oct. 14, 2013, which is hereby incorporated by reference for all purposes as if fully set forth herein.

BACKGROUND

1. Field

Exemplary embodiments of the present invention relate to an organic light-emitting display apparatus and a method of manufacturing the same.

2. Discussion of the Background

An organic light-emitting display apparatus includes a hole injection electrode, an electron injection electrode, and an organic light-emitting device including an organic emission layer disposed between the hole injection electrode and the electron injection electrode. The organic light-emitting display apparatus is a self-emission type display apparatus that generates light as excitons generated when holes injected from the hole injection electrode and electrons injected from the electron injection electrode combine with each other in the organic emission layer, change from an excited state to a ground state.

Since the organic light-emitting display apparatus is the self-emission type display apparatus that does not require a separate light source, the organic light-emitting display apparatus may be driven at a low voltage, light-weighted, and thin. Also, the organic light-emitting display apparatus is receiving attention as a next-generation display apparatus due to its high quality characteristics, such as a wide viewing angle, a high contrast, and a quick response speed.

SUMMARY

Exemplary embodiments of the present invention provide an organic light-emitting display apparatus and a method of manufacturing the same.

Additional features of the invention will be set forth in the description which follows, and in part will be apparent from the description, or may be learned by practice of the invention.

An exemplary embodiment of the present invention discloses an organic light-emitting display apparatus including: a display substrate including pixel areas and a non-pixel area; a sealing substrate disposed facing the display substrate; a spacer disposed in the non-pixel area of the display substrate, between the display substrate and the sealing substrate, and configured to maintain an interval between the display substrate and the sealing substrate; and a metal layer disposed under the spacer.

An exemplary embodiment of the present invention also discloses a method of manufacturing an organic light-emitting display apparatus, the method including, forming a metal layer in a non-pixel area of a display substrate, and a pixel area of the display substrate; forming a spacer in correspondence with the metal layer; and bonding a sealing substrate and the display substrate, wherein the sealing substrate is supported by the spacer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION

Figure 1:
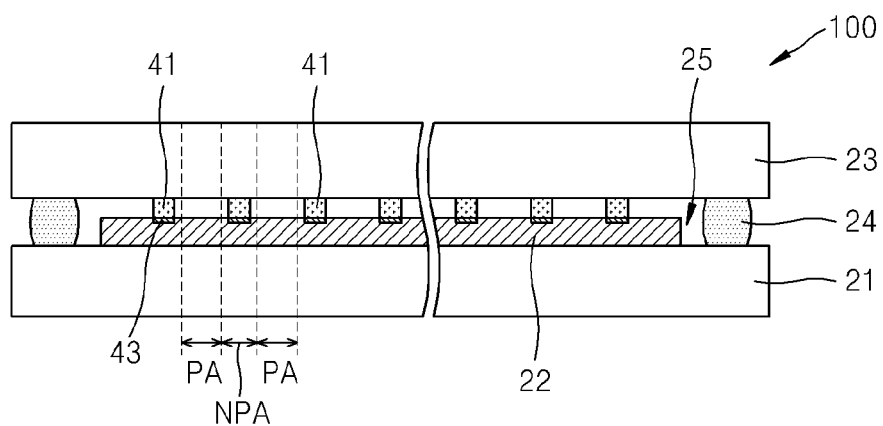
FIG. 1 is a cross-sectional view of an organic light-emitting display apparatus according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

FIG. 1 is a cross-sectional view of an organic light-emitting display apparatus 100 according to an exemplary embodiment of the present invention.

Referring to FIG. 1, the organic light-emitting display apparatus 100 includes an organic emission unit 22 disposed on a display substrate 21, and a sealing substrate 23 for sealing the organic emission unit 22. The organic light-emitting display apparatus 100 also includes a spacer 41 disposed between the display substrate 21 and the sealing substrate 23 to maintain an interval between the display substrate 21 and the sealing substrate 23.

The organic emission unit 22 is disposed on the display substrate 21. The display substrate 21 and the organic emission unit 22 include a non-pixel area NPA and a plurality of pixel areas PAs divided by the non-pixel area NPA.

The non-pixel area NPA is an area where a light is not visible, and may be a non-emission area. The non-pixel area NPA may not include an emission structure for emitting a light. According to other embodiments, the non-emission area may at least partially include an emission structure, wherein light emission is blocked by a light shielding structure.

The pixel area PA is an area where a light is visible, and may include an emission structure. For example, each pixel area PA may include an organic light-emitting device (OLED) for realizing organic light emission. The plurality of pixel areas PA may be arranged in a matrix form.

The organic emission unit 22 may include a plurality of OLEDs emitting at least one of red, green, blue, and white lights.

The sealing substrate 23 is formed of a transparent material such that an image realized from the organic emission unit 22 may pass through, and prevent oxygen and moisture from penetrating into the organic emission unit 22.

Edges of the display substrate 21 and edges of the sealing substrate 23 are bonded by a sealing member 24. Accordingly, an inner space 25 between the display substrate 21 and the sealing substrate 23 is sealed. A moisture absorbent or a filler may be disposed in the inner space 25.

The spacer 41 is disposed in the non-pixel area NPA, between the display substrate 21 and the sealing substrate 23 to maintain the interval between the display substrate 21 and the sealing substrate 23. The spacer 41 may be used to prevent display characteristics from being deteriorated by an external shock.

A metal layer 43 is disposed below the spacer 41. The metal layer 43 may reinforce the strength of the spacer 41 supporting the sealing substrate 23. Compression pressure applied to the spacer 41 by an external shock may deform the spacer 41.

Here, the metal layer 43 may be disposed below the spacer 41 so as to reduce deformation of the organic light-emitting display apparatus 100 with respect to the compression pressure. Accordingly, strength of the organic light-emitting display apparatus 100 may be reinforced further compared to when there is only the spacer 41.

Exemplary embodiments will now be described in detail with reference to FIGS. 2 through 6.

Figure 2:
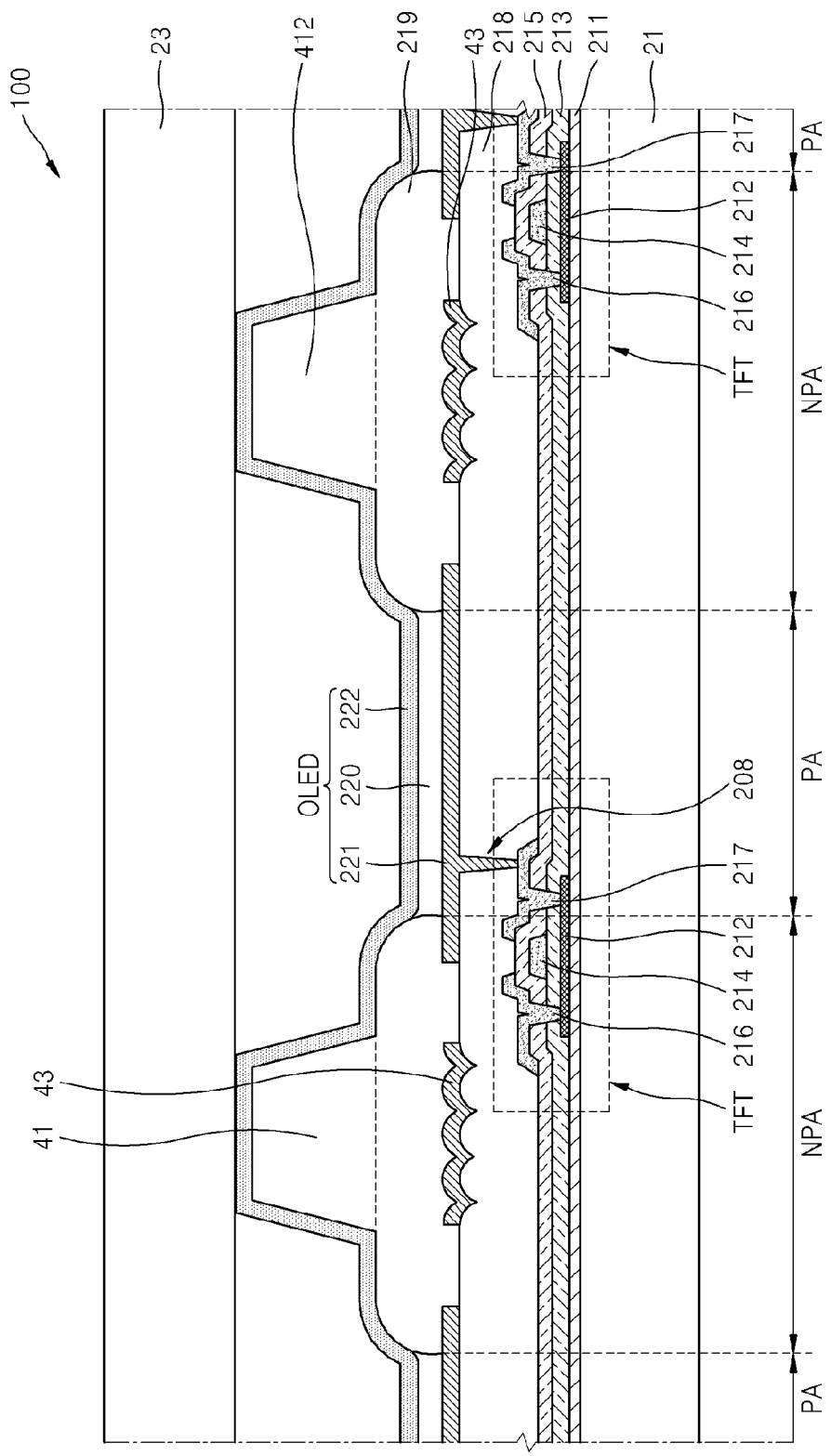
FIG. 2 is a partial cross-sectional view of the organic light-emitting display apparatus of FIG. 1.

FIG. 2 is a partial cross-sectional view of the organic light-emitting display apparatus 100 of FIG. 1.

Referring to FIG. 2, the organic light-emitting display apparatus 100 includes the display substrate 21, the sealing substrate 23, the spacer 41, and the metal layer 43 disposed below the spacer 41. The organic light-emitting display apparatus 100 may further include a buffer film 211, a thin-film transistor (TFT), an OLED, and a pixel-define film 219.

The display substrate 21 includes the non-pixel area NPA and the plurality of pixel areas PA divided by the non-pixel area NPA. The display substrate 21 may be formed of a transparent glass material including silicon dioxide ($SiO_2$) as a main component. However, a material of the display substrate 21 is not limited thereto, and may be any one of various materials, such as a ceramic material, a transparent plastic material, and a metal material.

The sealing substrate 23 is disposed facing the display substrate 21, and may seal the OLED between the display substrate 21 and the sealing substrate 23 from external air.

The buffer film 211 may prevent impurity ions from being diffused onto a top surface of the display substrate 21, block penetration of moisture and external air, and flatten a surface.

The TFT includes an active layer 212, a gate electrode 214, a source electrode 216, and a drain electrode 217. A gate insulating film 213 is disposed between the gate electrode 214 and the active layer 212.

The active layer 212 may be disposed on the buffer film 211. The active layer 212 may be formed of an inorganic semiconductor, such as amorphous silicon or polysilicon, or an organic semiconductor. According to exemplary embodiments, the active layer 212 may be formed of an oxide semiconductor. Examples of the oxide semiconductor may include metals of groups 12, 13, and 14, such as zinc (Zn), indium (In), gallium (Ga), tin (Sn), cadmium (Cd), germanium (Ge), and hafnium (Hf), and oxides thereof.

The gate insulating film 213 is disposed on the buffer film 211 to cover the active layer 212, and the gate electrode 214 is disposed on the gate insulating film 213. The gate insulating film 213 may be formed of an insulating material to electrically insulate the gate electrode 214 and the active layer 212 from each other. According to exemplary embodiments, the gate insulating film 213 may be formed of an inorganic material or an organic material, or may have a stacked structure of an inorganic material and an organic material.

An interlayer insulating film 215 is disposed on the gate insulating film 213 to cover the gate electrode 214, and the source electrode 216 and the drain electrode 217 are disposed on the interlayer insulating film 215 contacting the active layer 212 through a contact hole.

A structure of the TFT is not limited to the above, and may vary. For example, the TFT according to the current embodiment has a top gate structure, but may alternatively have a bottom gate structure wherein the gate electrode 214 is disposed below the active layer 212.

A pixel circuit (not shown) including a capacitor may be formed together with the TFT.

A planarization film 218 may be disposed on the interlayer insulating film 215 covering the pixel circuit including the TFT. The planarization film 218 may reduce stepped portions created by the underlying layers, and flatten the surface on which the organic light-emitting device OLED is disposed. The planarization film 218 may be formed of an inorganic material and/or an organic material.

The OLED is disposed on the planarization film 218, and includes a first electrode 211, an intermediate layer 220 including an organic emission layer, and a second electrode 222. The pixel-define film 219 is disposed to cover a part of the planarization film 218 and first electrode 221, and defines the pixel area PA and the non-pixel area NPA.

Holes and electrons injected from the first and second electrodes 221 and 222 of the OLED may combine in the organic emission layer of the intermediate layer 220 to emit a light.

The intermediate layer 220 may include the organic emission layer. According to an exemplary embodiment, the intermediate layer 220 may include the organic emission layer and at least one of a hole injection layer (HIL), a hole transport layer (HTL), an electron transport layer (ETL), and an electron injection layer (EIL). Alternatively, the intermediate layer 220 may include the organic emission layer and other various functional layers.

The second electrode 222 is disposed on the intermediate layer 220. The second electrode 222 may form an electric field with the first electrode 221 such that a light may be emitted from the intermediate layer 220. The first electrode 221 may be patterned according to pixels, and the second electrode 222 may be formed such that a common voltage may be applied throughout all pixels.

The first and second electrodes 221 and 222 may be a transparent electrode or a reflective electrode. The first electrode 221 may operate as an anode and the second electrode 222 may operate as a cathode, but an embodiment is not limited thereto. For example, the first electrode 221 may operate as a cathode and the second electrode 222 may operate as an anode.

Only one OLED is shown in FIG. 2, but the organic emission unit 22 (refer to FIG. 1) may include a plurality of OLEDs. One pixel may be formed per OLED, and each pixel may realize a red, green, blue, or white color. However, an embodiment is not limited thereto. The intermediate layer 220 may be commonly formed throughout the first electrode 221 regardless of locations of pixels. Here, the organic emission layer may be formed, for example, by perpendicularly stacking layers including emission materials for emitting red, green, and blue lights, or by mixing the emission materials. Other colors may be used as long as a white light may be emitted.

The organic light-emitting display apparatus 100 may further include a color changing layer or color filter for changing a white light to a predetermined color.

A passivation layer (not shown) may be disposed on the second electrode 222, and may cover and protect the OLED. The passivation layer may be an inorganic insulating film and/or an organic insulating film.

The spacer 41 may be disposed in the non-pixel area NPA and may be disposed between the display substrate 21 and the sealing substrate 23 to maintain the interval between the display substrate 21 and the sealing substrate 23. The spacer 41 may be used to prevent the display characteristics from being deteriorated due to an external shock.

According to exemplary embodiments, the spacer 41 is disposed on the pixel-define film 219. The spacer 41 may protrude from the pixel-define film 219 towards the sealing substrate 23.

According to exemplary embodiments, the pixel-define film 219 and the spacer 41 may be integrally formed via a photographic process or photolithographic process using a photosensitive material. In other words, the pixel-define film 219 and the spacer 41 may be simultaneously formed by an exposure process adjusting exposure using a half-tone mask.

According to exemplary embodiments, the half-tone mask may include a transmissive area, a semi-transmissive area, and an opaque area. An opening of the pixel-define film 219 may be formed in correspondence to the transmissive area of the half-tone mask, the pixel-define film 219 may be formed in correspondence to the semi-transmissive area, and the spacer 41 may be formed in correspondence to the opaque area. Accordingly, the spacer 41 is formed of the same material as the pixel-define film 219.

However, an embodiment is not limited thereto, and the pixel-define film 219 and the spacer 41 may be sequentially or separately formed, or may be independent components formed by using different materials.

The second electrode 222 and/or a passivation layer (not shown) may be disposed on the spacer 41.

The metal layer 43 may be disposed below the spacer 41 to improve mechanical strength of the organic light-emitting display apparatus 100, together with the spacer 41. According to exemplary embodiments, the metal layer 43 may be formed of the same material as the first electrode 221. According to exemplary embodiments, the metal layer 43 may be formed on the same layer as the first electrode 221. For example, the metal layer 43 may be formed on the planarization film 218 like the first electrode 221.

The metal layer may include essentially any conductive material that may be used to form the first electrode 221. The metal layer 43 may include ITO, IZO, ZnO, or In2O3. The metal layer 43 may further include silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), or calcium (Ca), or a combination thereof. Also, the metal layer 43 may be formed to have either a single layer or a multi-layered structure including the aforesaid metal and/or an alloy thereof. In an exemplary embodiment, the metal layer 43 may have an ITO/Ag/ITO structure.

According to exemplary embodiments, the metal layer 43 may be deposited while depositing the first electrode 221. In this case, processes may be simplified since a separate mask process for forming the metal layer 43 is not performed. Alternatively, the metal layer 43 may be formed by using a different material and a different process from the first electrode 221.

According to exemplary embodiments, at least a part of the metal layer 43 may be curved up and down. Here, "up" denotes direction towards the sealing substrate 23 and the "down" denotes direction towards the display substrate 21.

According to exemplary embodiments, at least a part of the metal layer 43 may have an embossing shape. Accordingly, the metal layer 43 may have an increased volume with respect to the same deposition thickness. Such an embossing shape of the metal layer 43 considers a limitation of a deposition thickness when the metal layer 43 is simultaneously deposited with the first electrode 221. As the volume of the metal layer 43 is increased, strength of supporting the spacer 41 may be increased.

According to exemplary embodiments, a part of the planarization film 218 may be processed to have an embossing shape such that the metal layer 43 has the embossing shape. The embossing shape may be formed via any one of various methods, such as a laser process, a wet or dry etching process, and an imprint process. According to exemplary embodiments, the embossing shape may be formed via a half-tone mask process.

The metal layer 43 may be spaced apart from the first electrode 221. Alternatively, according to circumstances, the metal layer 43 may be connected to the first electrode 221. According to exemplary embodiments, the metal layer 43 may operate as a wire line for supplying a voltage or data to the organic light-emitting display apparatus 100.

Figure 3:
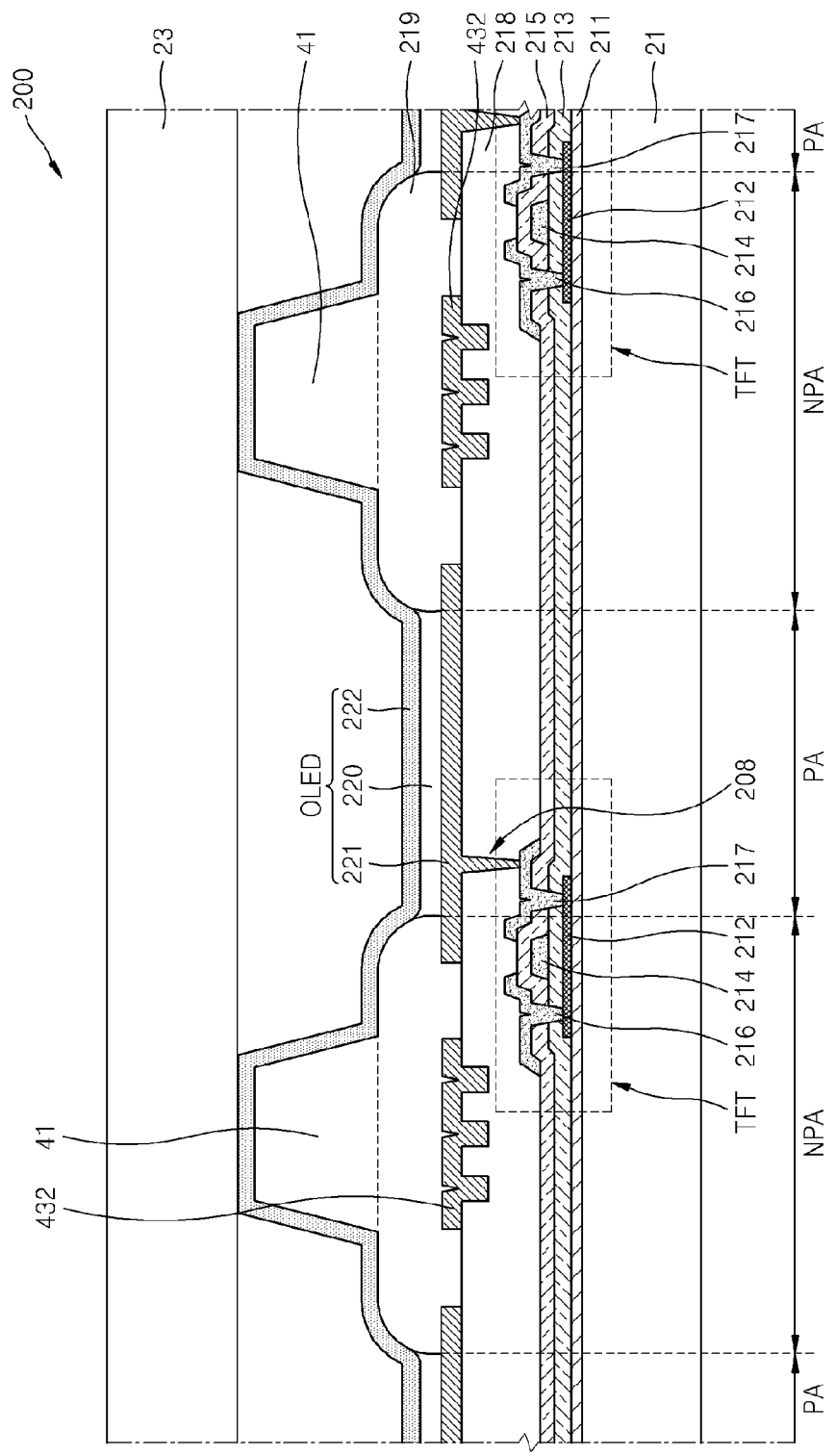
FIG. 3 is a partial cross-sectional view of an organic light-emitting display apparatus according to an exemplary embodiment of the present invention.
Figure 4:
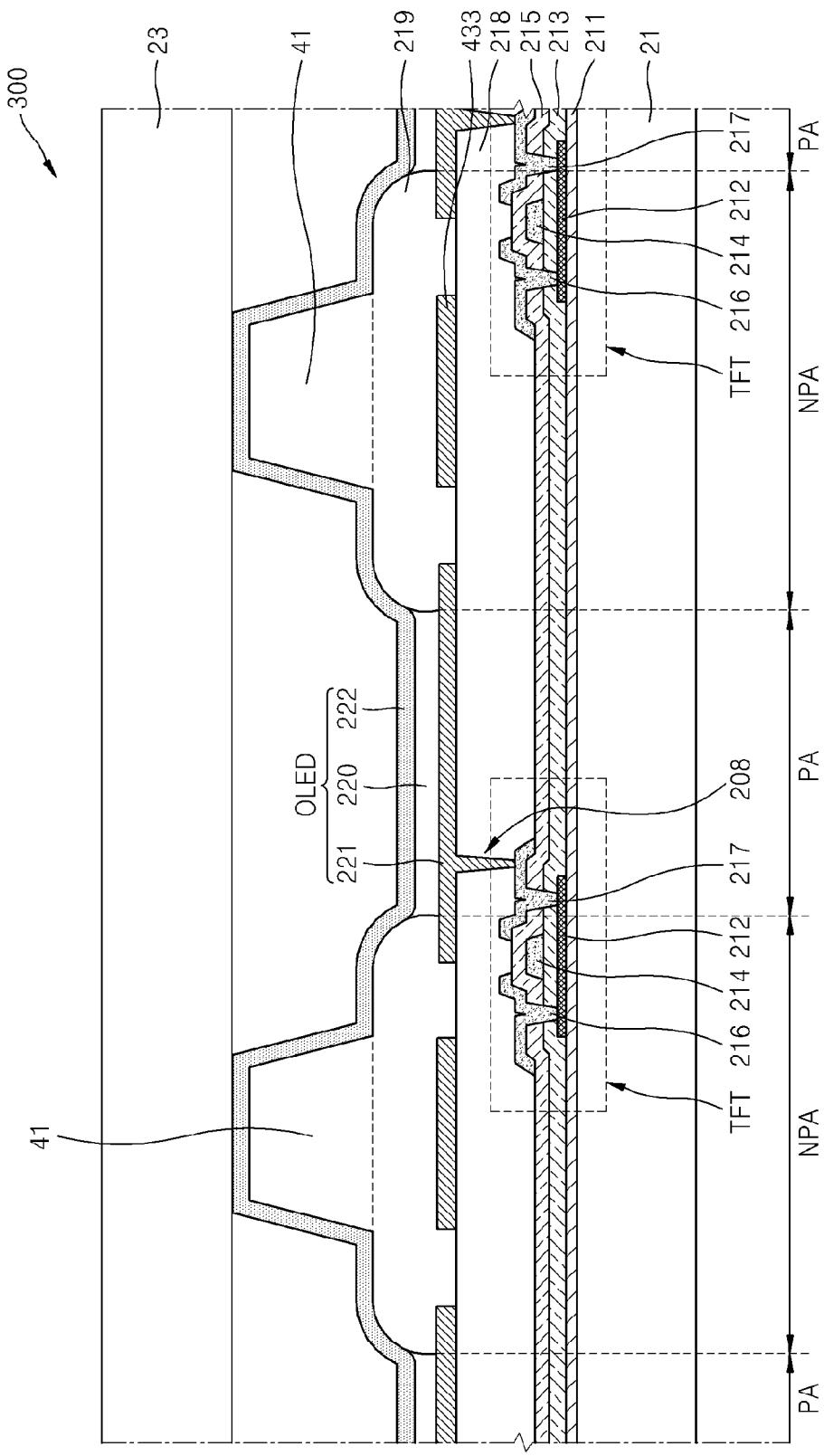
FIG. 4 is a partial cross-sectional view of an organic light-emitting display apparatus according to an exemplary embodiment of the present invention.

FIGS. 3 and 4 are partial cross-sectional views of organic light-emitting display apparatuses 200 and 300 according to other embodiments of the present invention. In FIGS. 2 through 6, like reference numerals denote like elements, and overlapping descriptions are not repeated for simplification of description.

Referring to FIGS. 3 and 4, shapes of metal layers 432 and 433 of the organic light-emitting display apparatuses 200 and 300 are different from that of the metal layer 43 of the organic light-emitting display apparatus 100 of FIG. 2.

The metal layer 432 of FIG. 3 includes a plurality of grooves. Accordingly, the metal layer 432 may have an uneven structure. Such an uneven structure may be realized by forming a plurality of grooves on a top surface of the planarization film 218 and depositing the metal layer 432 thereon. Sizes and shapes of the grooves of FIG. 3 may vary.

The metal layer 433 of FIG. 4 has a flat shape. In this embodiment, processes may be simplified compared to the metal layers 43 and 432 of FIGS. 2 and 3.

Figure 5:
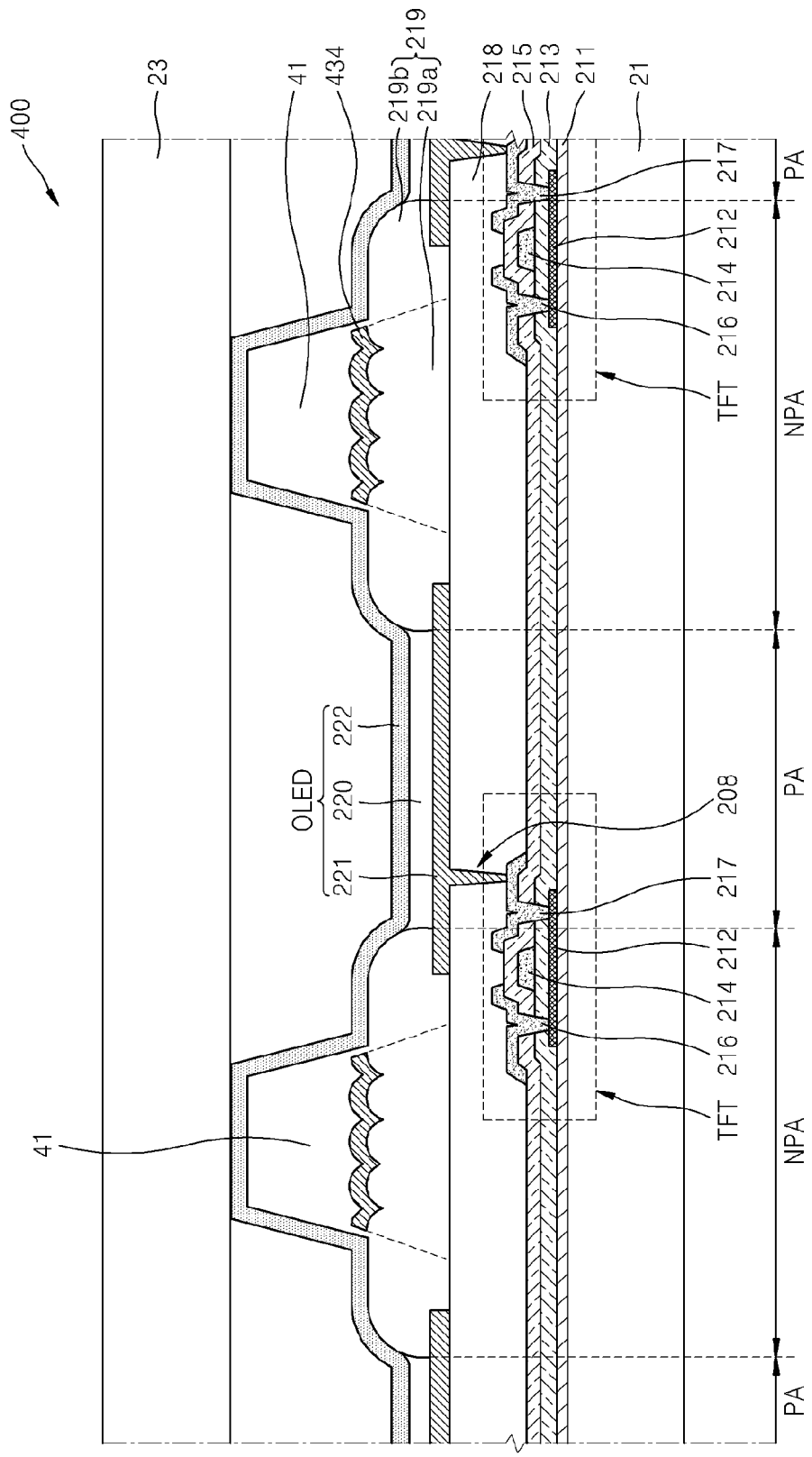
FIG. 5 is a partial cross-sectional view of an organic light-emitting display apparatus according to an exemplary embodiment of the present invention.

FIG. 5 is a partial cross-sectional view of an organic light-emitting display apparatus 400 according to another embodiment of the present invention.

Referring to FIG. 5, the organic light-emitting display apparatuses 100 and 400 are different from each other since a metal layer 434 of the organic light-emitting display apparatus 400 is disposed on the pixel-define film 219.

The metal layer 434 may be disposed on the pixel-define film 219. A shape of the metal layer 434 is not limited to FIG. 5, and may have any one of various shapes, such as an embossing shape, an uneven shape, and a flat shape.

In order to dispose the metal layer 434 on the pixel-define film 219, a first portion 219a of the pixel-define film 219 is formed. The metal layer 323 is formed on the first portion 219a. Then, a second portion 219b of the pixel-define film 219 and the spacer 41 may be simultaneously formed.

The metal layer 434 may be formed by using the same material and/or the same deposition process as the first electrode 221.

Figure 6:
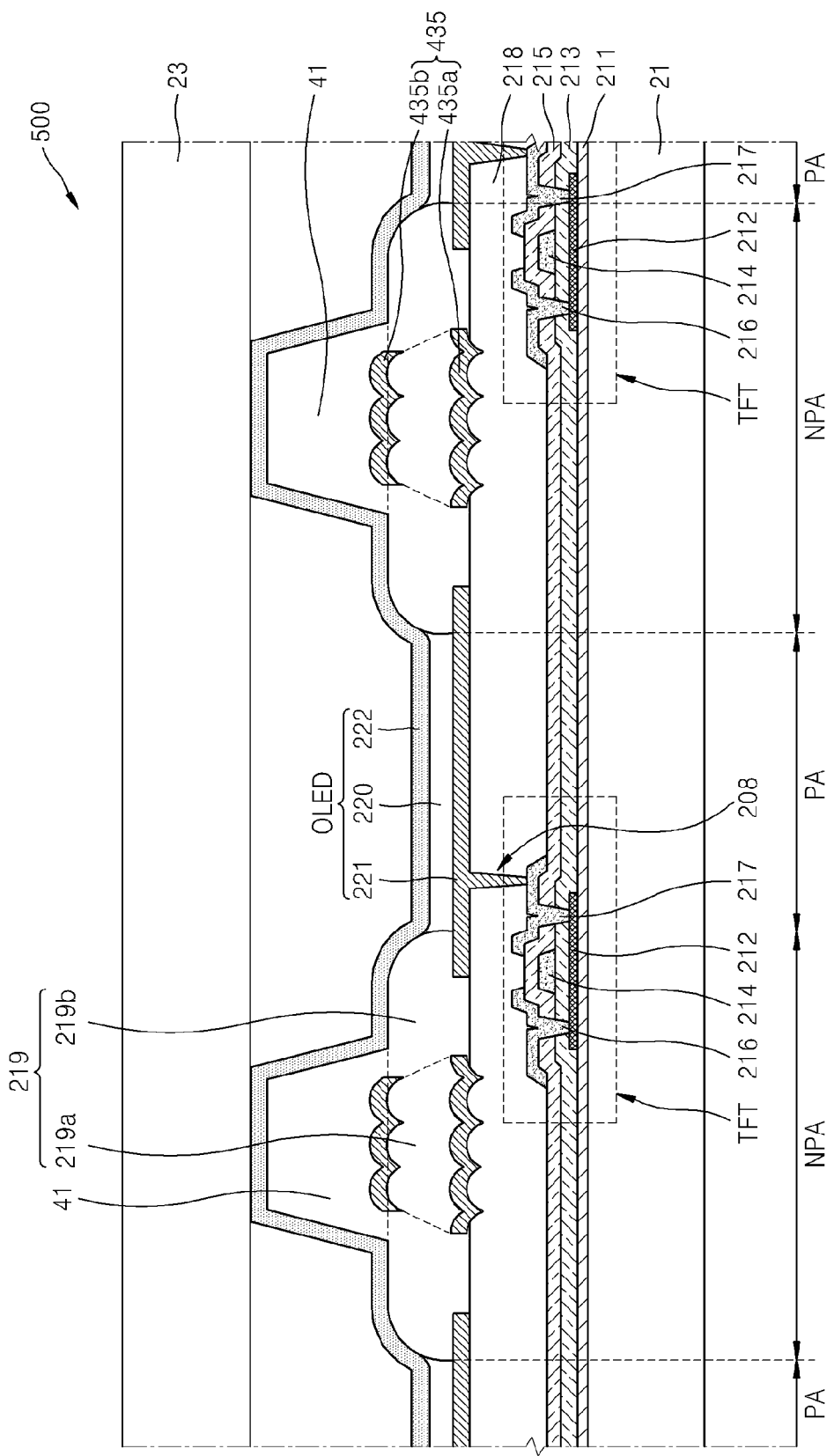
FIG. 6 is a partial cross-sectional view of an organic light-emitting display apparatus according to an exemplary embodiment of the present invention.

FIG. 6 is a partial cross-sectional view of an organic light-emitting display apparatus 500 according to another embodiment of the present invention. In FIGS. 2 and 6, like reference numerals denote like elements, and overlapping descriptions are not repeated for simplification of description.

Referring to FIG. 6, a first metal layer 435a is disposed below the pixel-define film 219 and a second metal layer 435b is disposed on the pixel-define film 219 in the organic light-emitting display apparatus 500.

In other words, the organic light-emitting display apparatus 500 includes the first metal layer 435a below the pixel-define film 219 and the second metal layer 435b on the pixel-define film 219, increasing the support strength of the spacer 41.

Although only the first and second metal layers 435a and 435b are shown in FIG. 5, a metal layer 435 may alternatively further include an additional layer.

FIGS. 7A through 7F are cross-sectional views for describing a method of manufacturing any one of the organic light-emitting display apparatuses 100 through 500, according to an embodiment of the present invention. In the current embodiment the method is used to manufacture the organic light-emitting display apparatus 100 of FIG. 2.

Figure 7A:
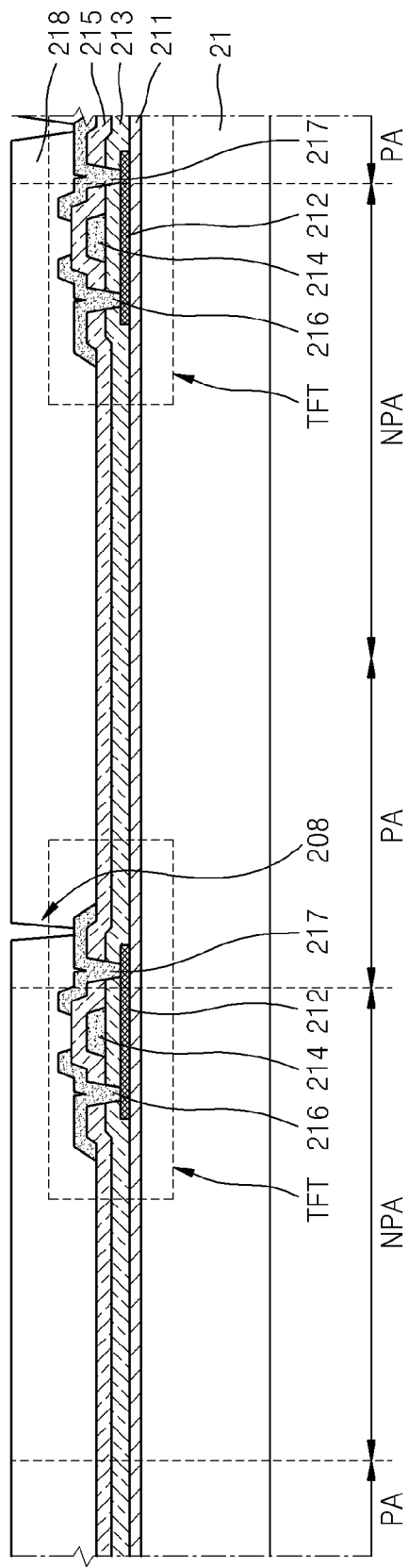
FIGS. 7A, 7B, 7C, 7D, 7E, and 7F are cross-sectional views for describing a method of manufacturing an organic light-emitting display apparatus, according to an exemplary embodiment of the present invention.

Referring to FIG. 7A, the buffer film 211 and the TFT are formed on the display substrate 21.

First, the buffer film 211 may be formed via any one of various deposition methods, such as a plasma enhanced chemical vapor deposition (PECVD) method, an atmospheric pressure CVD (APCVD) method, and a low pressure CVD (LPCVD) method. Before forming the buffer film 211 on the display substrate 21, a planarization process may be performed on the display substrate 21. For example, a chemical mechanical polishing process and/or an etch-back process may be performed on the display substrate 21 to obtain a substantially flat top surface on the display substrate 21.

The active layer 212 may be formed on the buffer film 211. The active layer 212 may be formed of an inorganic semiconductor, such as amorphous silicon or polysilicon, or an organic semiconductor. According to exemplary embodiments, the active layer 212 may be formed of an oxide semiconductor. The active layer 212 may be formed via any one of various methods, such as a PECVD method, an APCVD method, and an LPCVD method. The active layer 212 may be formed throughout on the buffer film 211, and then patterned via etching. Then, a crystallization process may be additionally performed.

Then, the gate insulating film 213 covering the active layer 212 may be formed on the buffer film 211. The gate insulating film 213 may be substantially uniformly formed on the buffer film 211 along a profile of the active layer 212.

The gate electrode 214 may be formed on the gate insulating film 213. The gate electrode 214 may be formed on a portion of the gate insulating film 213 where the active layer 212 is disposed therebelow. The gate electrode 214 may be formed of a metal, a metal alloy, a metal nitride, a conductive metal oxide, or a transparent conductive material.

The interlayer insulating film 215 may be formed on the gate insulating film 213 to cover the gate electrode 214. The interlayer insulating film 215 may be formed on the gate insulating film 213, in a substantially uniform thickness, along a profile of the gate electrode 214. The interlayer insulating film 215 may be formed by using a silicon compound.

The source electrode 216 and the drain electrode 217 may be formed on the interlayer insulating film 215. The source and drain electrodes 216 and 217 are spaced apart from each other based on the gate electrode 214, and are disposed adjacent to the gate electrode 214. The source and drain electrode 216 and 217 contact two ends of the active layer 212 via holes exposing the active layer 212 through the interlayer insulating film 215 and the gate insulating film 213. The source and drain electrodes 216 and 217 may be formed of a metal, a metal alloy, a metal nitride, a conductive metal oxide, or a transparent conductive material.

According to exemplary embodiments, the interlayer insulating film 215 and the gate insulating film 213 may be partially etched to form a hole exposing the active layer 212, and then the hole may be filled to form a conductive film (not shown) on the interlayer insulating film 215. Then, the conductive film may be patterned to form the source and drain electrodes 216 and 217.

The planarization film 218 covering the source electrode 216 and drain electrode 217 is formed on the interlayer insulating film 215. The planarization film 218 may have a thickness sufficient enough to completely cover the source and drain electrodes 216 and 217. The planarization film 218 may be formed of an inorganic material and/or an organic material. The planarization film 218 may be formed by using a spin-coating process, a printing process, a sputtering process, a CVD process, an atomic layer deposition (ALD) process, a PECVD process, a high density plasma-CVD (HDP-CVD) process, or a vacuum deposition process, according to a material of the planarization film 218.

A through hole 208 for exposing the drain electrode 217 may be formed on the planarization film 218.

Figure 7B:
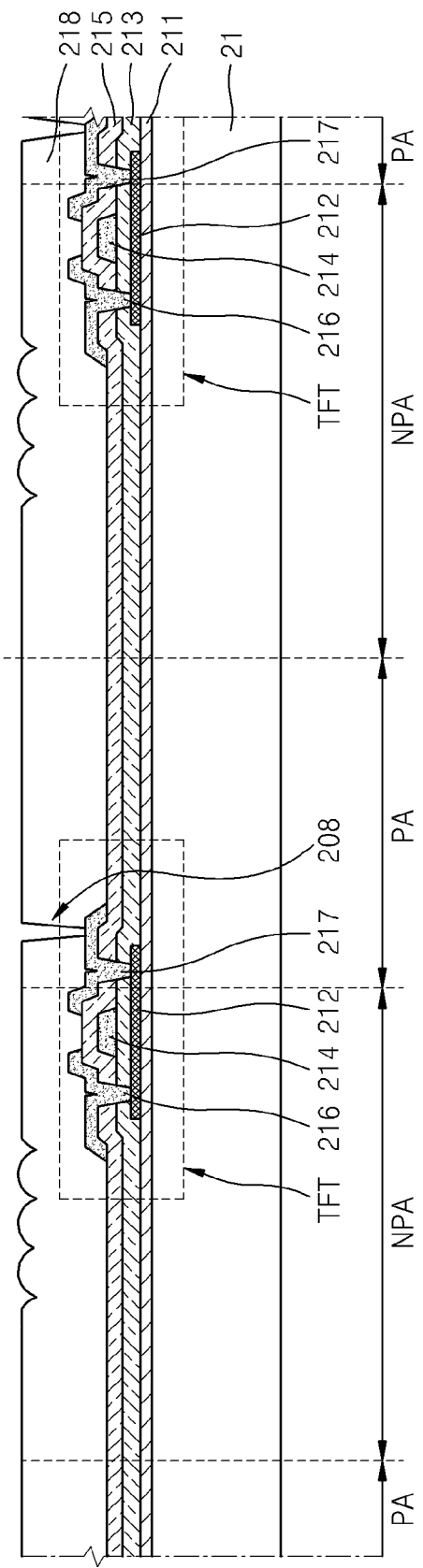

Referring to FIG. 7B, forming embossing shape or a plurality of grooves may be performed in a region of a top surface of the planarization film 218, where the metal layer 43 (refer to FIG. 7C) is to be formed. The process of forming the embossing shape and grooves may be performed by using an etching process or laser drilling technology, or an imprinting process.

Figure 7C:
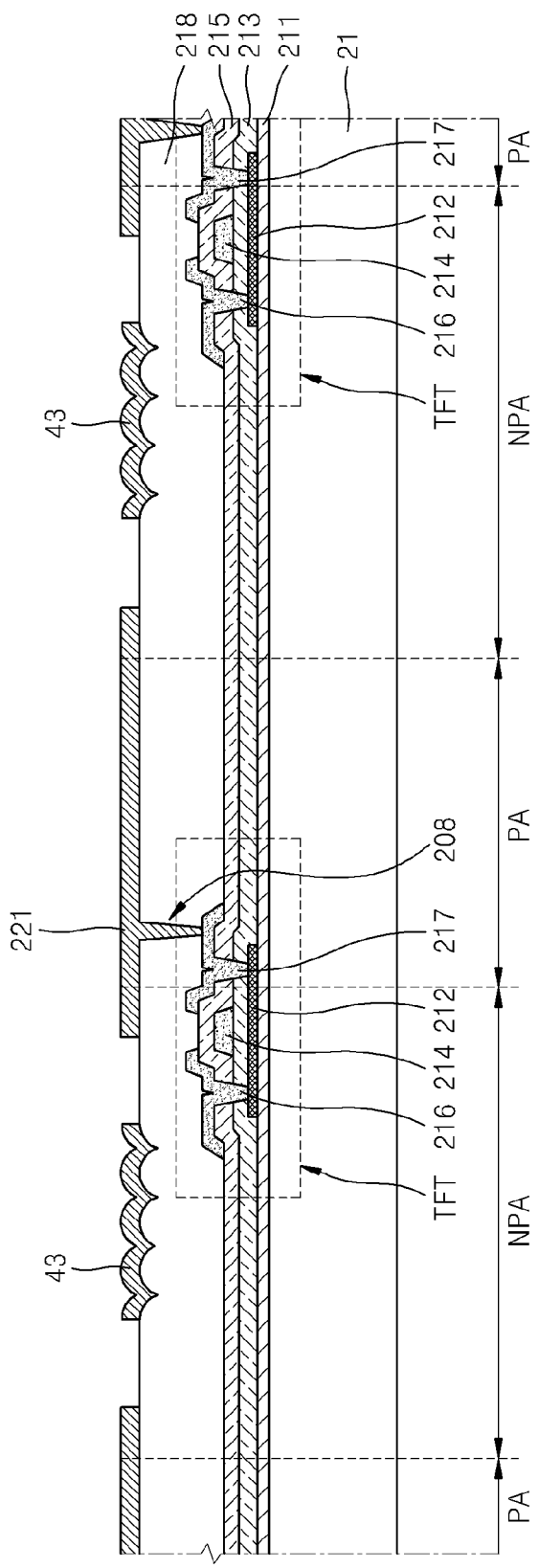

Referring to FIG. 7C, the first electrode 221 and the metal layer 43 are formed. The first electrode 221 and the metal layer 43 may be formed during the same process. For example, the first electrode 221 and the metal layer 43 may be simultaneously deposited, and then patterned via a patterning process. Alternatively, the first electrode 221 and the metal layer 43 may be formed via separate processes.

The first electrode 221 and the metal layer 43 may have a single layer or multilayer structure including a metal and an alloy.

The first electrode 221 and the metal layer 43 may be formed via at least one of a sputtering process, a vacuum deposition process, a CVD process, a pulse laser deposition process, a printing process, and an ALD process. The first electrode 221 may be patterned according to pixels.

Figure 7D:
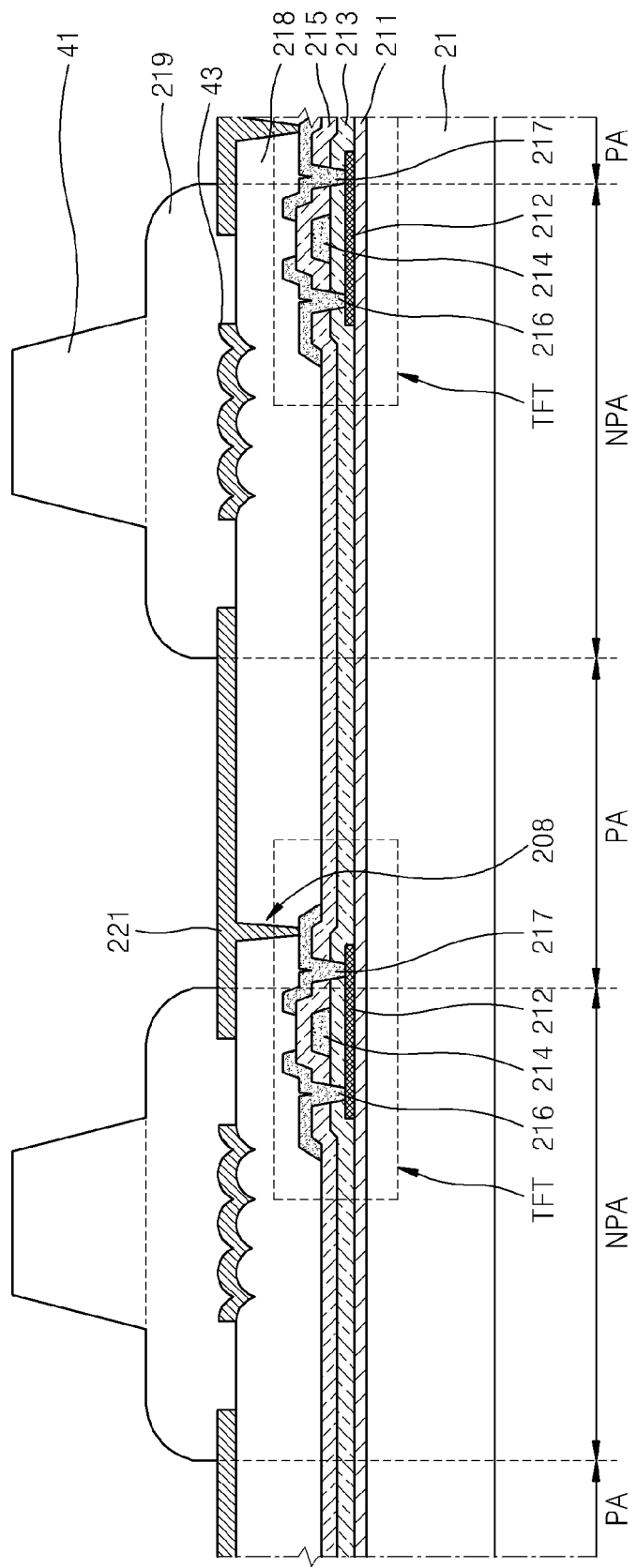

Referring to FIG. 7D, the pixel-define film 219 and the spacer 41 are formed. According to exemplary embodiments, the pixel-define film 219 and the spacer 41 may be simultaneously formed. At this time, a half-tone mask may be used. Alternatively, the pixel-define film 219 and the spacer 41 may be sequentially formed.

In order to form the pixel-define film 219, a preliminary pixel-define film (not shown) may be formed on the planarization film 218 and the first electrode 221. The preliminary pixel-define film may be formed of an organic material or an inorganic material. The preliminary pixel-define film may be formed by using a spin-coating process, a printing process, a sputtering process, a CVD process, an ALD process, a PECVD process, a HDP-CVD process, or a vacuum deposition process, according to a material of the preliminary pixel-define film.

The preliminary pixel-define film may be partially etched to form an opening exposing a part of the first electrode 221, thereby completing the pixel-define film 219. By forming the opening, an emission area and a non-emission area of the organic light-emitting display apparatus 100 may be defined. In other words, the opening of the pixel-define film 219 may be configured as an emission area.

The spacer 41 may be formed on the non-emission area of the pixel-define film 219. The spacer 41 may be formed using an organic material or an inorganic material. The spacer 41 may be formed of the same material as the pixel-define film 219. The spacer 41 may be formed by using a spin-coating process, a printing process, a sputtering process, a CVD process, an ALD process, a PECVD process, a HDP-CVD process, or a vacuum deposition process, according to a material of the spacer 41.

Figure 7E:
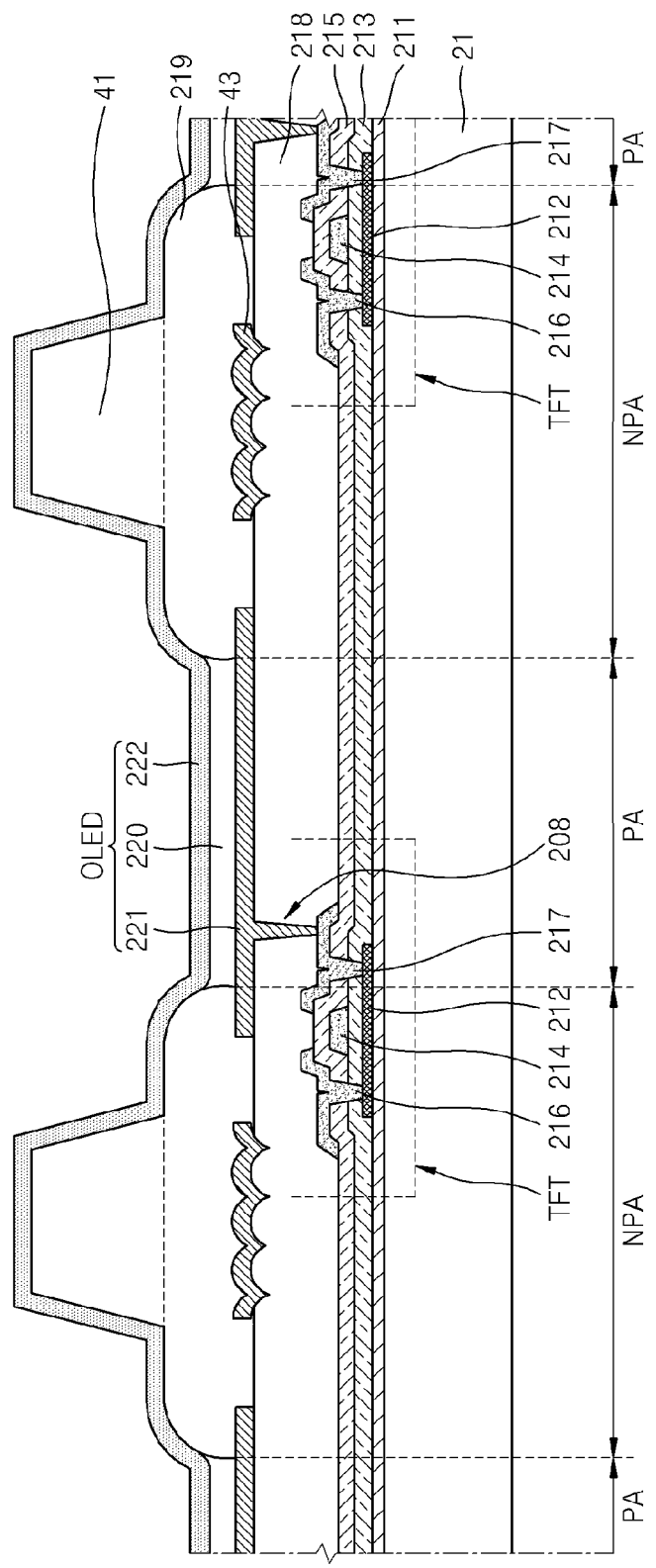

Referring to FIG. 7E, the intermediate layer 220 may be formed on the pixel area PA. The intermediate layer 220 may be a single layer or a plurality of layers. According to exemplary embodiments of the present invention, the intermediate layer 220 may be formed via a vacuum deposition method. Alternatively, the intermediate layer 220 may be formed via an inkjet printing method, a spin-coating method, or a thermal transfer method using a laser.

Then, the second electrode 222 may be formed on the intermediate layer 220. The second electrode 222 may also be formed on the pixel-define film 219 and on the spacer 41.

The second electrode 222 may be formed of a transparent conductive material. According to exemplary embodiments, the second electrode 222 may include indium tin oxide (ITO), indium zinc oxide (IZO), zinc tin oxide (ZTO), a zinc oxide (ZnO), or indium oxide (In2O3), which is a transparent conductive metal oxide. Alternatively, the second electrode 222 may be a thin film including at least one material of lithium (Li), calcium (Ca), lithium fluoride/calcium (LiF/Ca), lithium fluoride/aluminum (LiF/Al), Al, silver (Ag), magnesium (Mg), and ytterbium (Yb). For example, the second electrode 222 may have a structure of a single layer or stacked layers of Mg:Ag, Ag:Yb and/or Ag.

The second electrode 222 may be formed by using a sputtering process, a vacuum deposition process, a CVD process, a pulse laser deposition process, a printing process, or an ALD process. According to exemplary embodiments, the second electrode 222 may be formed such that a common voltage is applied throughout all pixels.

Then, a passivation layer (not shown) may be formed on the second electrode 222. The passivation layer may be deposited via any one of various deposition methods.

Figure 7F:
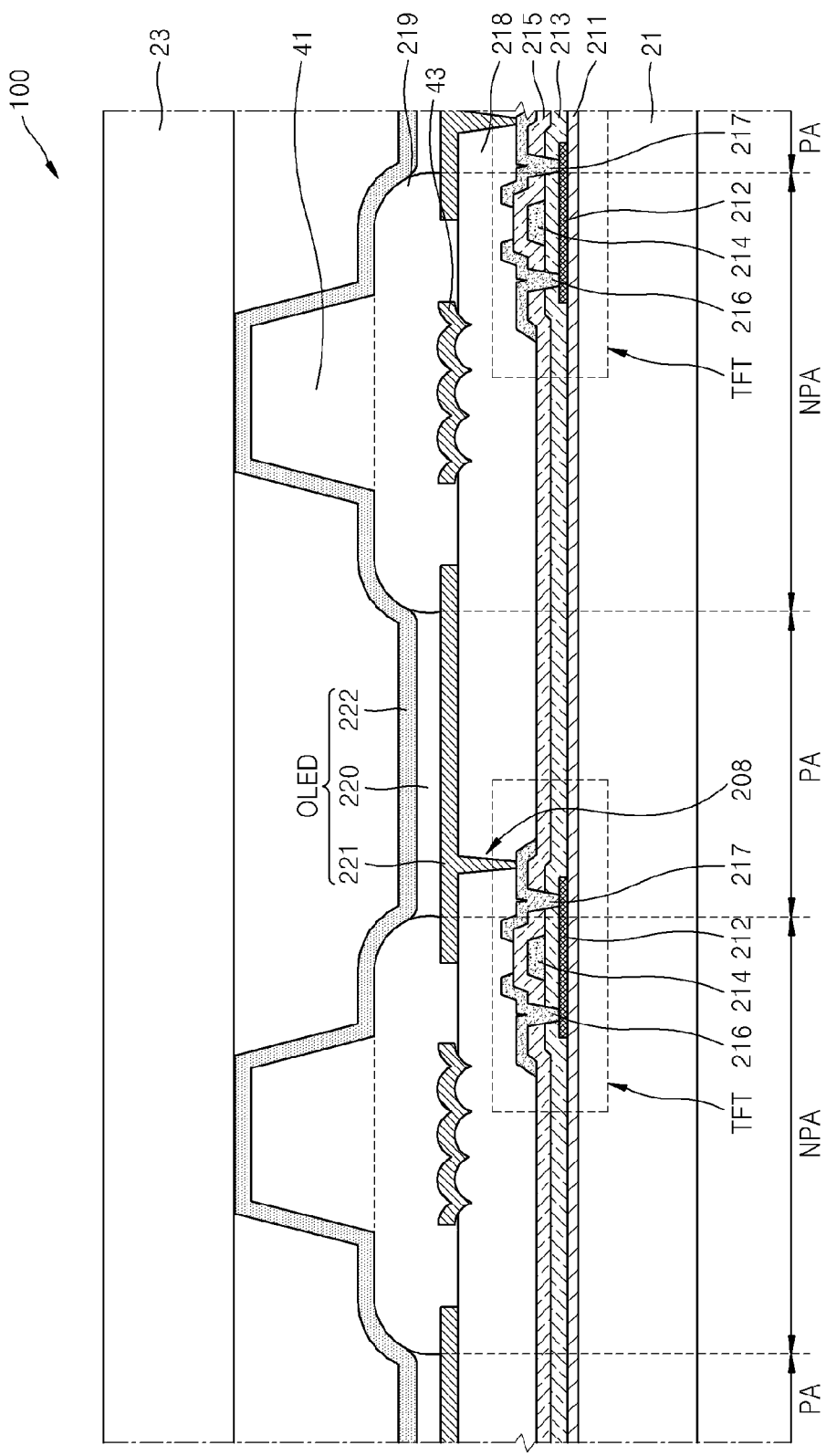

Referring to FIG. 7F, the sealing substrate 23 and the display substrate 21 are bonded to complete the organic light-emitting display apparatus 100.

In order to bond the sealing substrate 23 and the display substrate 21, the sealing member 24 is coated around the organic emission unit 21 of FIG. 1, and then the sealing member 24 may be hardened so that the sealing substrate 23 and the display substrate 21 are combined by the sealing member 24. According to exemplary embodiments, the sealing member 24 may be frit. In this case, ultraviolet rays may be radiated on the sealing member 24 to complete the combining. Alternatively, the display substrate 21 and the sealing substrate 23 may be combined to each other via any one of various methods according to a type of the sealing member 24.

Other functional layers may be additionally formed on the sealing substrate 23. Examples of the various functional layers include a color filter, a black matrix, a polarizing layer, a passivation layer, and a touch panel.

As described above, according to the exemplary of the above embodiments of the present invention, an organic light-emitting display apparatus includes a spacer and a metal layer disposed below the spacer, and thus strength of the organic light-emitting display apparatus may be reinforced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light-emitting display apparatus, comprising:
   a display substrate comprising pixel areas and a non-pixel area;
   a sealing substrate disposed facing the display substrate;
   a planarization film disposed on the display substrate;
   a spacer disposed on the planarization film in the non-pixel area of the display substrate, between the display substrate and the sealing substrate, and configured to maintain an interval between the display substrate and the sealing substrate; and a metal layer disposed between the planarization film and the spacer.

2. The organic light-emitting display apparatus of claim 1, wherein at least a part of the metal layer is curved up and down.

3. The organic light-emitting display apparatus of claim 1, wherein at least a part of the metal layer has an embossing shape.

4. The organic light-emitting display apparatus of claim 1, wherein the metal layer comprises a plurality of grooves.

5. The organic light-emitting display apparatus of claim 1, wherein the metal layer has a flat shape.

6. The organic light-emitting display apparatus of claim 1, further comprising an organic light-emitting device comprising a first electrode, an intermediate layer comprising an organic emission layer, and a second electrode disposed in each of the pixel areas, wherein the metal layer is disposed on the same layer as the first electrode.

7. The organic light-emitting display apparatus of claim 1, further comprising an organic light-emitting device comprising a first electrode, an intermediate layer comprising an organic emission layer, and a second electrode disposed in each of the pixel areas, wherein the metal layer is formed of the same material as the first electrode.

8. The organic light-emitting display apparatus of claim 1, further comprising a pixel-define film disposed in the non-pixel area, wherein the metal layer is disposed below or on the pixel-define film.

9. The organic light-emitting display apparatus of claim 1, further comprising a pixel-define film disposed below the spacer, wherein the metal layer comprises a first metal layer and a second metal layer, the first metal layer is disposed below the pixel-define film, and the second metal layer is disposed on the pixel-define film.

10. The organic light-emitting display apparatus of claim 1, further comprising:

a thin-film transistor disposed on the display substrate, the planarization film covering the thin-film transistor; and an organic light-emitting device, comprising; a first electrode, an intermediate layer comprising an organic emission layer, and a second electrode, and disposed on the planarization film, wherein the metal layer is spaced apart from the first electrode.

11. The organic light-emitting display apparatus of claim 10, wherein at least a part of a top surface of the planarization film within the non-pixel area comprises a plurality of grooves.

12. A method of manufacturing an organic light-emitting display apparatus, the method comprising:

forming a planarization film on a display substrate;

forming a metal layer on the planarization film in a non-pixel area of the display substrate and a pixel area of the display substrate;

forming a spacer on the metal layer; and bonding a sealing substrate and the display substrate, wherein the sealing substrate is supported by the spacer, and wherein the metal layer is disposed under between the planarization film and the spacer.

13. The method of claim 12, wherein the forming a spacer further comprises forming a pixel-define film for defining the pixel area and the non-pixel area, and the spacer and the pixel-define film are simultaneously formed.

14. The method of claim 13, wherein a half-tone mask is used to simultaneously form the spacer and the pixel-define film.

15. The method of claim 12, wherein the forming a metal layer further comprises forming an organic light-emitting device in which a first electrode, an intermediate layer comprising an organic emission layer, and a second electrode are sequentially stacked on each other, in the pixel area, and the metal layer and the first electrode are simultaneously formed.

16. The method of claim 12, further comprising forming an embossing shape or groove on a surface where the metal layer is deposited.

17. The method of claim 12, wherein at least a part of the metal layer is curved up and down.

18. The method of claim 12, wherein at least a part of the metal layer has an embossing shape.

19. The method of claim 12, wherein the metal layer comprises a plurality of grooves.

20. The method of claim 12, wherein the metal layer has a flat shape.

* * * * *